(12) United States Patent
Hasegawa et al.

(10) Patent No.: US 8,037,384 B2
(45) Date of Patent: Oct. 11, 2011

(54) SEMICONDUCTOR DEVICE

(75) Inventors: Takumi Hasegawa, Tachikawa (JP);
Motoyuki Sato, Ome (JP); Tomoji Nakamura, Fussa (JP); Nobuo Konami, Hamura (JP); Jun Matsushima, Sagamihara (JP)

(73) Assignee: Hitachi, Ltd., Tokyo (JP)

( * ) Notice: Subject to any disclaimer, the term of this patent is extended or adjusted under 35 U.S.C. 154(b) by 196 days.

(21) Appl. No.: 12/340,549

(22) Filed: Dec. 19, 2008

(65) Prior Publication Data

US 2009/0172488 A1 Jul. 2, 2009

(30) Foreign Application Priority Data

Dec. 27, 2007 (JP) ................................. 2007-336688

(51) Int. Cl.
*G01R 31/28* (2006.01)
(52) U.S. Cl. .......................... 714/728; 714/733; 714/739
(58) Field of Classification Search .................... 716/18; 713/176; 714/30, 729, 726, 733, 728, 739
See application file for complete search history.

(56) References Cited

U.S. PATENT DOCUMENTS

| | | | | |
|---|---|---|---|---|
| 5,991,898 A * | 11/1999 | Rajski et al. | ..................... | 714/30 |
| 7,058,869 B2 * | 6/2006 | Abdel-Hafez et al. | ......... | 714/729 |
| 7,234,092 B2 * | 6/2007 | Cooke | ........................... | 714/728 |
| 7,581,149 B2 * | 8/2009 | Sugawara | ..................... | 714/726 |
| 7,735,049 B2 * | 6/2010 | Wang et al. | ..................... | 716/18 |
| 2009/0292926 A1 * | 11/2009 | Daskalopoulos et al. | .... | 713/176 |

FOREIGN PATENT DOCUMENTS

| | | |
|---|---|---|
| JP | 10-170609 A | 6/1998 |
| JP | 2001-174515 A | 6/2001 |

* cited by examiner

*Primary Examiner* — David Ton
(74) *Attorney, Agent, or Firm* — Miles & Stockbridge P.C.

(57) ABSTRACT

A semiconductor device includes a test target circuit; scan chains that enable scanning of the test target circuit; a first random number generation circuit that forms test patterns supplied to the scan chains; a second random number generation circuit that is provided separately from the first random number generation circuit; and a random number control circuit that uses the random numbers generated by the second random number generation circuit to change the random numbers generated by the first random number generation circuit. In a test of the semiconductor device, since a period of a clock of a scan chain does not need to be longer than that of a clock of a pattern generator, the number of clocks of the pattern generator needed for a test can be prevented from increasing. Accordingly, a test time can be prevented from increasing.

6 Claims, 13 Drawing Sheets

FIG. 9
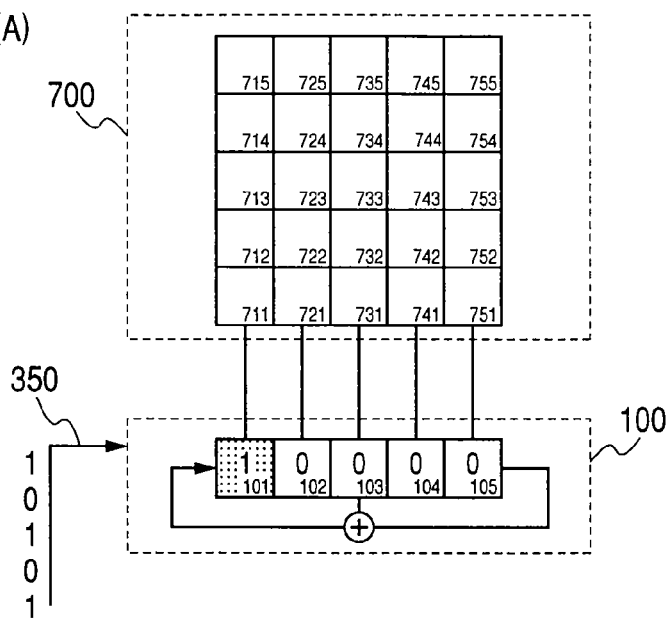
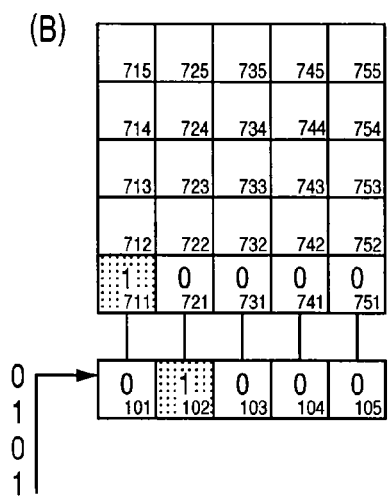
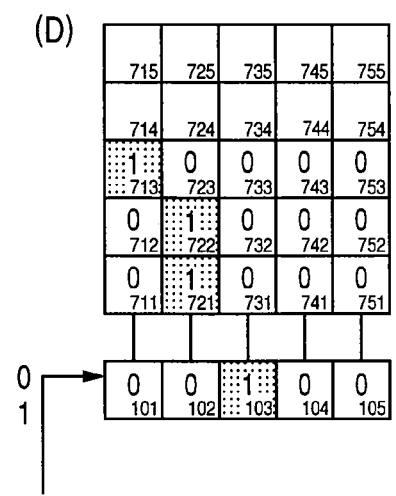
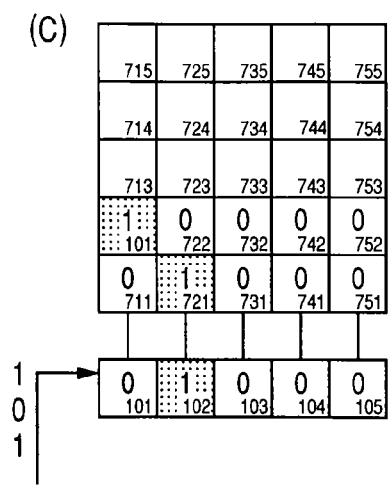
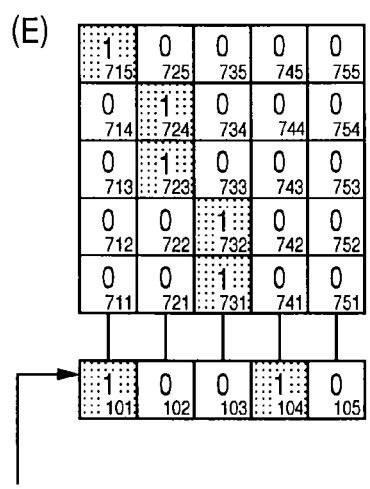

SEMICONDUCTOR DEVICE

CLAIM OF PRIORITY

The present application claims priority from Japanese patent application JP 2007-336688 filed on Dec. 27, 2007, the content of which is hereby incorporated by reference into this application.

FIELD OF THE INVENTION

The present invention relates to a semiconductor device and a self-diagnosis technology in the semiconductor device.

BACKGROUND OF THE INVENTION

Among test methods of a semiconductor integrated circuit, there is a test method that is called a built-in self-test (BIST) method. According to the BIST method, in a semiconductor integrated circuit that includes a pseudo random number pattern generator and a code compressor, a pseudo random number pattern is applied to a test target logic, and a compression result of a response pattern and an expected value are compared with each other, thereby enabling self-diagnosis.

The BIST is configured to include a pseudo random number test pattern generator that applies a large amount of patterns to a test circuit that has been scan-designed and a code compressor that determines the good or not by compressing output response series and performing a comparison operation in only final codes. In general, in a pattern generator and a patter compressor, a linear feedback shift register is used. In the pattern generator that uses the linear feedback shift register, except for "0", all patterns can be pseudo-randomly generated.

As examples of a document that has described the BIST including the pattern generator, there are JP-A-Hei10(1998)-170609 and JP-A-2001-174515.

According to a technology that is described in JP-A-Hei10 (1998)-170609, a test circuit and a test target LSI are formed. In this case, the test circuit has a plurality of shift registers that are configured to connect a test target circuit and a plurality of flip-flops. In the test target LSI, a random number pattern generator and a code compressor, each of which is composed of a linear feedback shift register, are incorporated. In this case, a clock frequency divider is incorporated, and a shift clock that is applied to the random number pattern generator is also applied to the clock frequency divider. The clock frequency divider changes a period of the shift clock to a period of ½, ¼, or ⅛ in accordance with signals input from a clock control pin, and applies the shift clock to the code compressor and the plurality of shift registers.

According to a technology that is described in JP-A-2001-174515, a flip-flop group in a logic integrated circuit is connected by scan chains, a random number generation circuit and a code compressor are incorporated in the logic integrated circuit, a clock signal is supplied to the flip-flop group, the random number generation circuit, and the code compressor, random number patterns that are sequentially generated in the random number generation circuit in synchronization with the clock signal are written in the flip-flop group and shift-scanned, and the result thereof is compressed by the code compressor. In addition, a portion or all of clock signals of latch elements that constitute the random number generation circuit are temporarily blocked to temporarily stop generation and output of random numbers, and an average value of a continuous length of 1 or 0 of random numbers that shift-scan the flip-flop group in the logic integrated circuit is increased.

SUMMARY OF THE INVENTION

The inventors have examined the related art and discovered the following facts. In the technology that is disclosed in JP-A-Hei10(1998)-170609, if a period of a clock of a scan chain is longer than that of a clock of a pattern generator, the number of clocks of the pattern generator that is needed for a test may increase, which results in increasing a test time. In the technology that is disclosed in JP-A-2001-174515, when a rate of change of data on the scan chain is arbitrarily set, clock control needs to be performed from the outside during a scan shift operation. When clock control is not performed from the outside, a rate of change of data on the scan chain cannot be arbitrarily set. In addition, as the related art, when the clock of the pattern generator is temporarily blocked to temporarily stop generation of the random numbers, it may become difficult to design timing or layout.

Accordingly, the invention has been made to solve the above-described problems, and it is an object of the invention to provide a technology for preventing test time from increasing due to an increase in the number of clocks of a pattern generator needed for a test, when a linear feedback shift register is used.

It is another object of the invention to provide a technology for stopping generation of random numbers by a pattern generator to reduce a rate of change of data on a scan chain, even though a clock signal is not blocked when a linear feedback shift register is used.

These and other object and novel features can be apparent from the description of the present specification and the accompanying drawings.

Representative features of the invention that are disclosed in the present specification are described in brief as follows.

That is, a semiconductor device includes a test target circuit to be tested, scan chains that enable scanning of the test target circuit, a first random number generation circuit that generates random numbers to form test patterns supplied to the scan chains, a second random number generation circuit that is provided separately from the first random number generation circuit and generates random numbers, and a random number control circuit that uses the random numbers generated by the second random number generation circuit to change the random numbers generated by the first random number generation circuit. Since a period of a clock of a scan chain does not need to be longer than that of a clock of a pattern generator, the number of clocks of the pattern generator needed for a test can be prevented from increasing. Accordingly, a test time can be prevented from increasing.

Effects that are obtained by the representative features of the invention disclosed in the present specification are described in brief as follows.

That is, when a linear feedback shift register is used, it is possible to prevent a test time from increasing due to an increase in the number of clocks of a pattern generator needed for a test. In addition, it is possible to stop generation of random numbers by a pattern generator to reduce a rate of change of data on a scan chain, even though a clock signal is not blocked.

BRIEF DESCRIPTION OF THE DRAWINGS

FIGS. 9A, 9B, 9C, 9D, and 9E are diagrams illustrating the operation of a main portion of the self-diagnosis-type logic integrated circuit shown in FIG. 6;

DETAILED DESCRIPTION OF THE PREFERRED EMBODIMENTS

1. Representative Embodiments

Figure 1:
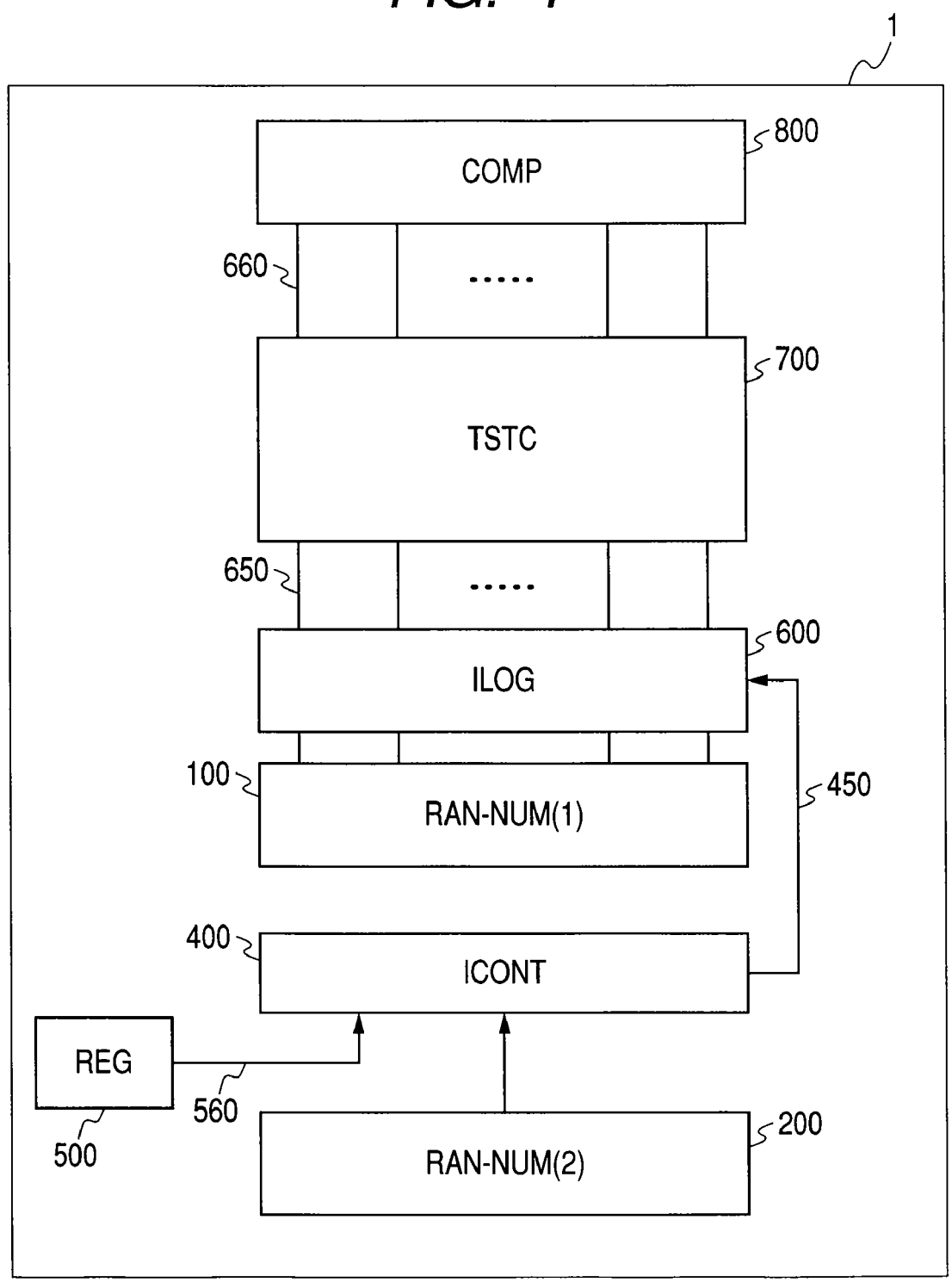
FIG. 1 is a block diagram illustrating an example of the configuration of a self-diagnosis-type logic integrated circuit that is an example of a semiconductor device according to an embodiment of the invention.

First, the outline of the representative embodiments of the invention that are disclosed in the present specification will be described. Like numbers refer to like elements throughout.

[1] A semiconductor device 1 according to the representative embodiment of the invention includes a test target circuit 700 to be tested, a scan chain 650 that enables scanning of the test target circuit, a first random number generation circuit 100 that generates random numbers to form a test pattern supplied to the scan chain, a second random number generation circuit 200 that is provided separately from the first random number generation circuit 100 and generates random numbers, and a random number control circuit that uses the random numbers generated by the second random number generation circuit 200 to change the random numbers generated by the first random number generation circuit 100.

The random number control circuit uses the random numbers generated by the second random number generation circuit to change the random numbers generated by the first random number generation circuit. Since a period of a clock of the scan chain does not need to be longer than that of a clock of the pattern generator, the number of clocks of the pattern generator needed for a test can be prevented from increasing. As a result, a test time can be prevented from increasing. In addition, it is possible to reduce a rate of change of data on the scan chain.

[2] The random number control circuit can be configured to include an inversion logic unit 600 that can invert a logic of an output value of the first random number generation circuit and an inversion control circuit 400 that can use the random numbers generated by the second random number generation circuit to control the operation of the inversion logic unit.

[3] The random number control circuit can be configured to include an inversion logic unit 600 that can invert a logic of an output value of the first random number generation circuit, a condition setting circuit 500 that can set an inversion control condition in the inversion control circuit, and an inversion control circuit 400 that can use the random numbers generated by the second random number generation circuit to control the operation of the inversion logic unit, under the conditions set by the condition setting circuit.

[4] The inversion logic unit can be configured to include exclusive OR circuits 601 to 605 that perform an exclusive OR operation on an output signal from the first random number generation circuit and an inversion control signal output from the inversion control circuit.

[5] The random number control circuit can be configured to include a run/stop control circuit 300 that can use the random number generated by the second random number generation circuit to control the random number generation operation to run or stop in the first random number generation circuit.

[6] The random number control circuit can be configured to include a run/stop control circuit 300 that can use the random numbers generated by the second random number generation circuit to control the random number generation operation to run or stop in the first random number generation circuit, and a condition setting circuit 500 that can set a control condition in the run/stop control circuit.

[7] The condition setting circuit can be configured to include a state machine that temporally changes the appearance probability of a logical value output from the run/stop control circuit.

[8] A semiconductor device includes a test target circuit 700 to be tested; a scan chain 650 that enables scanning of the test target circuit; a first random number generation circuit 100 that generates random numbers to form a test pattern supplied to the scan chain; a second random number generation circuit 200 that is provided separately from the first random number generation circuit and generates random numbers; and a random number control circuit that uses the random numbers generated by the second random number generation circuit to change the random numbers generated by the first random number generation circuit. At this time, the random number control circuit can be configured to include an inversion logic unit 600 that can invert a logic of an output value from the first random number generation circuit; an inversion control circuit 400 that can use the random numbers generated by the second random number generation circuit to control the operation of the inversion logic unit; and a run/stop control circuit 300 that can use the random numbers generated by the second random number generation circuit to control the random number generation operation to run or stop in the first random number generation circuit.

2. Description of Embodiments

Next, embodiments will be described in detail.

First Embodiment

FIG. 1 shows a self-diagnosis-type logic integrated circuit that is an example of a semiconductor device according to an embodiment of the invention.

In FIG. 1, a self-diagnosis-type logic integrated circuit 1 that is to be tested is not limited to the specific configuration, but can be configured as follows. The self-diagnosis-type logic integrated circuit 1 includes a first random number generator (RAM-NUM (1)) 100, a second random number generator (RAM-NUM (2)) 200 that functions as a secondary random number generator, an inversion control circuit (ICONT) 400, a condition setting circuit (REG) 500, an inversion logic unit (ILOG) 600, a test target circuit (TSTC) 700, and a code compressor (COMP) 800. The self-diagnosis-type logic integrated circuit 1 is formed on one semiconductor substrate, such as a single crystal silicon substrate, using a known semiconductor integrated circuit manufacturing technology. A portion or all of random number values that are outputted from individual resisters of the first random number generator 100 are logically inverted by the inversion logic unit 600, and scanned in the test target circuit 700 as test patterns by a scan chain 650. After the test is completed, the test result of the test target logic is scanned out by a scan chain 660, and compressed and encoded by the code compressor 800. When the scan-in operation is performed, the random numbers that are generated by the second random number generator 200 functioning as the secondary random number generator are inputted to the inversion control circuit 400, an inversion control signal 450 is outputted from the inversion control circuit 400 under the conditions set by an inversion control condition setting signal group 560 output from the condition setting circuit 500, and the inversion logic unit 600 controls whether to invert or non-invert the random number values output from the first random number generator 100.

Figure 2:
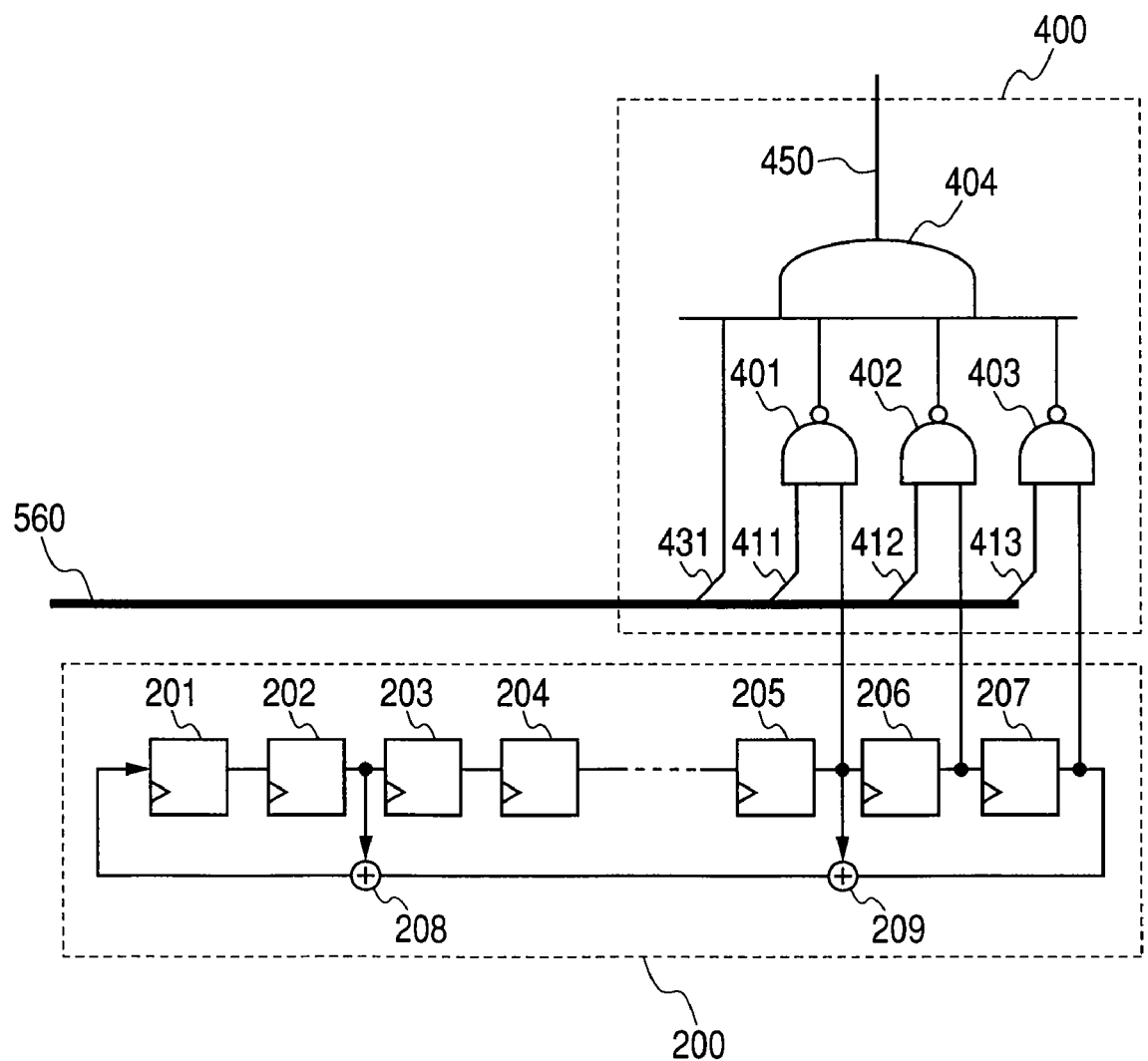
FIG. 2 is a circuit diagram illustrating an example of the configuration of a main portion of the self-diagnosis-type logic integrated circuit shown in FIG. 1.

FIG. 2 shows an example of the configuration of the second random number generator 200 functioning as the secondary random number generator and the inversion control circuit 400.

The second random number generator 200 that functions as the secondary random number generator uses a linear feedback shift register. The second random number generator 200 includes storage elements 201 to 207 that operate as a shift register, and a circuit that feeds backs outputs of exclusive OR circuits 208 and 209, which perform an exclusive OR operation on an output value of the storage element 207 at the final stage of the shift registers and an output value of the specific storage element, to the storage element 201 at the first stage of the shift registers.

The inversion control circuit 400 includes NAND elements 401 to 403 and an AND elements 404. The inversion control condition setting signal group 560 includes a plurality of inversion control condition setting signals 411 to 413 and 431. Among the inversion control condition setting signals, the inversion control condition setting signals 411 to 413 are transmitted to input terminals of the NAND elements 401 to 403. In addition, the inversion control condition setting signal 431 is inputted to the AND element 404 without passing through the NAND element. The output signals from the storage elements 205, 206, and 207 are transmitted to the other input terminals of the NAND elements 401 to 403. A NAND logic of the input signals is calculated by the NAND elements 401 to 403, and an AND logic of output signals from the NAND elements 401 to 403 and the inversion control condition setting signal 431 is calculated by the AND element 404 at the rear stage. The output of the AND element 404 is transmitted to the inversion logic circuit 600 as the inversion control signal 450. When the inversion control condition setting signal 431 has a logical value of "0", the inversion control signal 450 always has a logical value of "0" regardless of the logical values of the other inversion control condition setting signals 411 to 413. When the inversion control condition setting signal 431 has a logical value of "1" and the inversion control condition setting signals 411 to 413 each have a logical value of "0", the inversion control signal 450 always has a logical value of "1". In addition, when the inversion control condition setting signal 431 has a logical value of "1" and only one of the inversion control condition setting signals 411 to 413 has a logical value of "1" and the other inversion control condition setting signals each have a logical value of "0", depending on the output value of the second random number generator 200 that functions as the secondary random number generator, the inversion control signal 450 has a logical value of "0" with the probability of ½ and a logical value of "1" at the probability of ½. In the same method, when the inversion control condition setting signal 431 has a logical value of "1" and two of the inversion control condition setting signals 411 to 413 have a logical value of "1" and the other inversion control condition setting signal has a logical value of "0", depending on the output value of the second random number generator 200 that functions as the secondary random number generator, the inversion control signal 450 has a logical value of "0" with the probability of ¾ and a logical value of "1" at the probability of ¼. Hereinafter, in the same method as the above method, the appearance probability of a logical value "0" or "1" of the inversion control signal 450 is controlled depending on the value of the inversion control condition setting signal group 560.

In addition, if a state machine is incorporated in the condition setting circuit 500, even though external control is not performed while patterns are generated, it is possible to automatically change the inversion control condition setting signal group 560 that is outputted from the condition setting circuit 500. That is, if the inversion control condition setting signal group 560 is temporally changed by the state machine, it is possible to temporally change the appearance probability of the logical value "0" or "1" of the inversion control signal 450.

Figure 3:
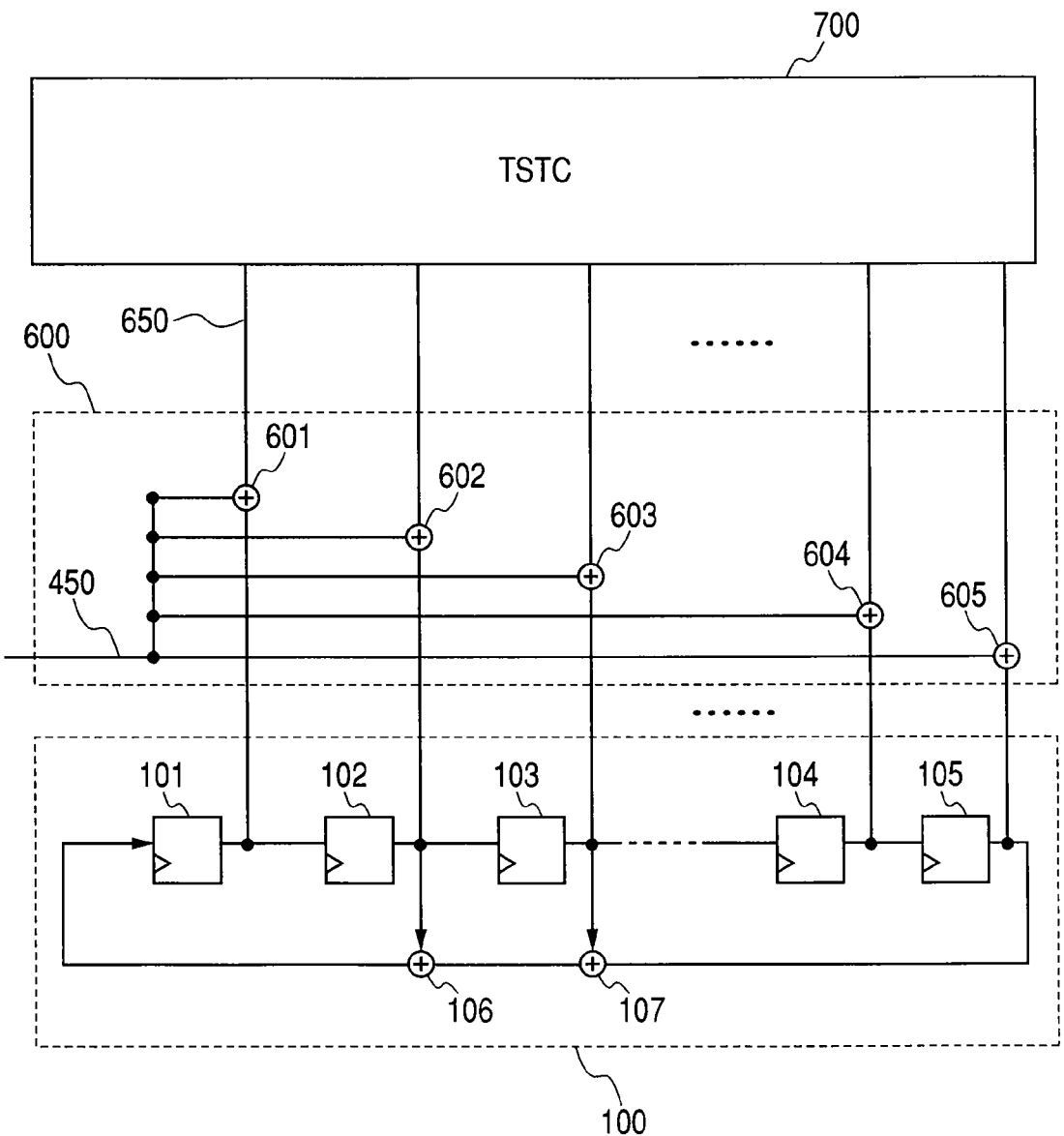
FIG. 3 is a circuit diagram illustrating an example of the configuration of a main portion of the self-diagnosis-type logic integrated circuit shown in FIG. 1.

FIG. 3 shows an example of the configuration of the first random number generator 100 and the inversion logic unit 600.

The first random number generator 100 uses a linear feedback shift register. The first random number generator 100 includes storage elements 101 to 105 that operate as a shift register, and a circuit that feeds backs outputs of exclusive OR circuits 106 and 107, which perform an exclusive OR operation on an output value of the storage element 105 at the final stage of the shift registers and an output value of the specific storage element, to the storage element 101 at the first stage of the shift registers.

The inversion logic unit 600 includes exclusive OR circuits 601 to 605 that performs an exclusive OR operation on an output value of the first random number generator 100 and the inversion control signal 450. When the inversion control signal 450 has a logical value of "0", the value that is outputted from the first random number generator 100 is not inverted and scanned in the test target circuit 700 as a test pattern by the scan chain 650. When the inversion control signal 450 has a logical value of "1", the value that is outputted from the first random number generator 100 is logically inverted by the exclusive OR circuits 601 to 605 that perform an exclusive OR operation, and the logically inverted value is scanned in the test target circuit 700 as a test pattern by the scan chain 650. Accordingly, if the appearance probability of the logical value "0" or "1" of the inversion control signal 450 is controlled, a portion or all of the output values of the first random number generator 100 can be logically inverted and scanned in the test target circuit 700 as test patterns.

Figure 4:
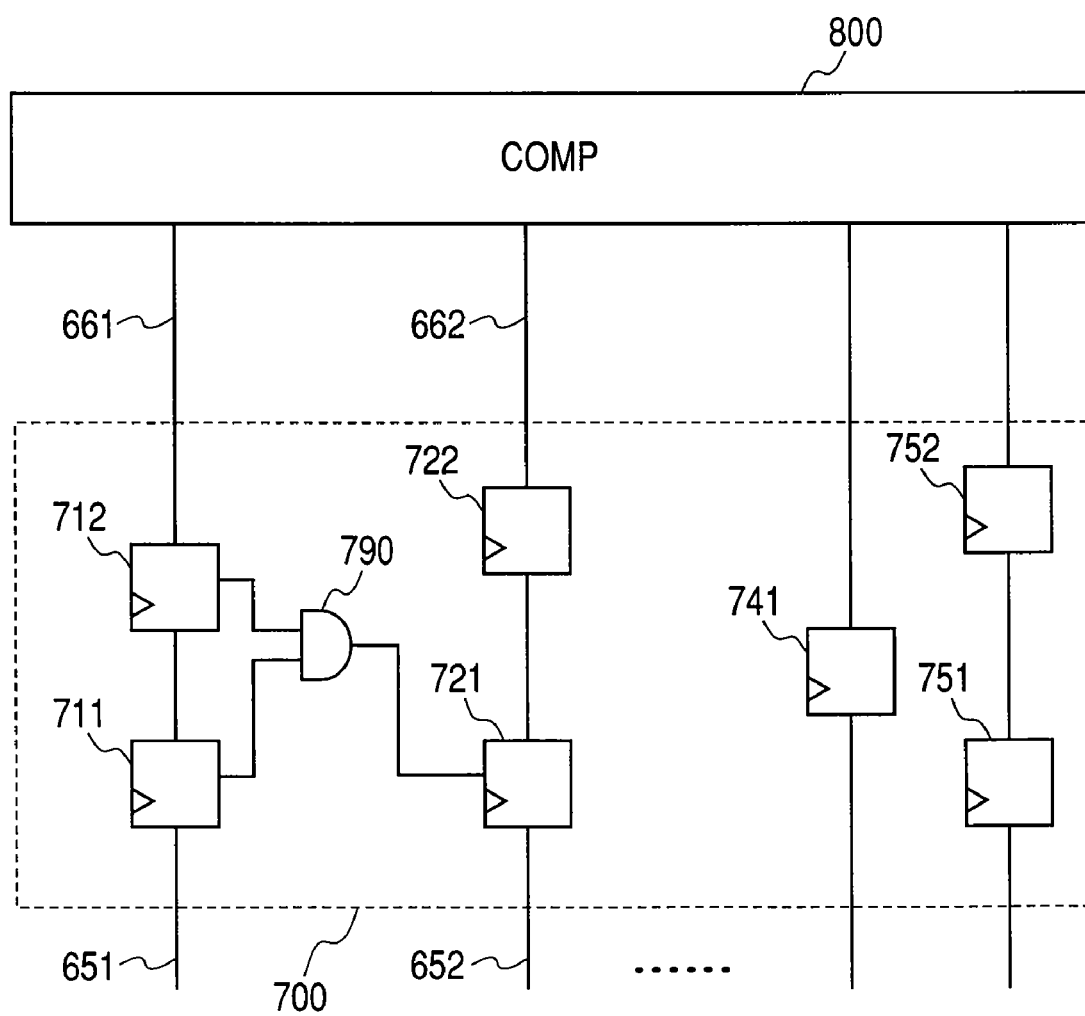
FIG. 4 is a circuit diagram illustrating an example of the configuration of a main portion of the self-diagnosis-type logic integrated circuit shown in FIG. 1.
Figure 5:
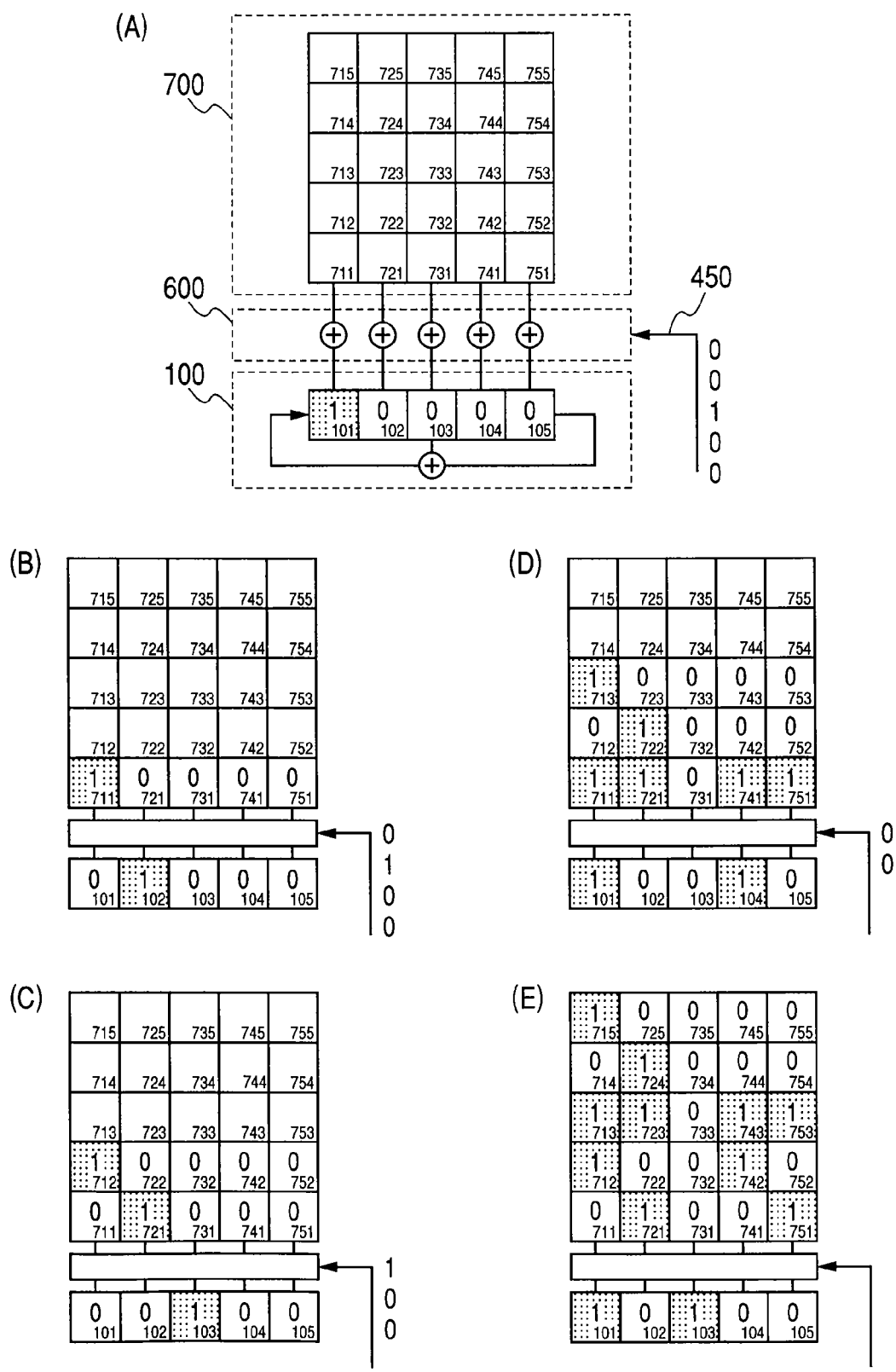
FIGS. 5A, 5B, 5C, 5D, and 5E are diagrams illustrating the operation of a main portion of the self-diagnosis-type logic integrated circuit shown in FIG. 1.

FIG. 4 shows an example of the configuration of the test target circuit 700.

In FIG. 4, reference numerals 711, 712, 721, 722, 741, 751, and 752 denote storage elements. An output terminal of each of the storage elements 711 and 712 that exist on the scan chain 651 is connected to an input terminal of the AND element 790, and an output terminal of an AND element 790 is connected to an input terminal of the storage element 721 that exists on the scan chain 652. When a test is performed, the test patterns that are set to the storage elements 711 and 712 by the scan chain 651 are inputted to the AND element 790, and an output value thereof is stored in the storage element 721. The values that are stored in the storage element 721 are collected to the code compressor using the scan chain 662 and it is determined whether each code is correct or not. In this way, the test is performed.

The operation of the above configuration will be described.

As an example of the operation, the following case is considered. In FIG. 2, among the inversion control condition setting signal group 560, the inversion control condition setting signal 411 has a logical value of "0", the logical values of the remaining inversion control condition setting signals 412, 413, and 431 is scan-shifted as 1, and the logical value of the inversion control signal 450 is changed to have "00100" for every shift clock.

FIGS. 5A to 5E show the operation of the first random number generator 100, the inversion logic unit 600, and the test target circuit 700. As described above, the logical value of the inversion control signal 450 is changed to have "00100" for every shift clock.

FIG. 5A shows a state where a scan-in operation starts.

FIG. 5B shows a state where a first scan clock is applied. The value that is stored in the storage element 101 is shifted to the storage element 102, and a newly generated random number is stored in the storage element 101. Since the logical value of the inversion control signal 450 is 0, the values that are outputted from the storage elements 101 to 105 scanned in the storage elements 711, 712, 713, 714, and 715 that exist on the scan chains without being inverted.

FIG. 5C shows a state where a second scan clock is applied. Similar to the case of FIG. 5B, the scan-in operation is performed.

FIG. 5D shows a state where a third scan clock is applied. When a clock is applied, the value that is stored in the storage element 101 is shifted to the storage element 102, and a newly generated random number is stored in the storage element 101. Since the logical value of the inversion control signal 450 is 1, the values that are outputted from the storage elements 101 to 105 are inverted and then scanned in the storage elements 711, 712, 713, 714, and 715 that exist on the scan chains.

FIG. 5E shows a state where the above-described process is repeated and test patterns are applied to all of the storage elements 711 to 715, 721 to 725, 731 to 735, 741 to 745, and 751 to 755 that exist on the scan chains of the test target circuit.

In this case, as an example of a circuit that is compared with the circuit according to this embodiment, a pattern generator using a linear feedback shift register will be described. FIGS. 13A to 13F show the pattern generator using the linear feedback shift register. In FIGS. 13A to 13F, a pattern generator 900 includes storage elements 901 to 905. The pattern generator 900 is connected to the storage elements 711 to 715, 721 to 725, 731 to 735, 741 to 745, and 751 to 755 of the test target circuit 700 by the scan chain.

Figure 13:
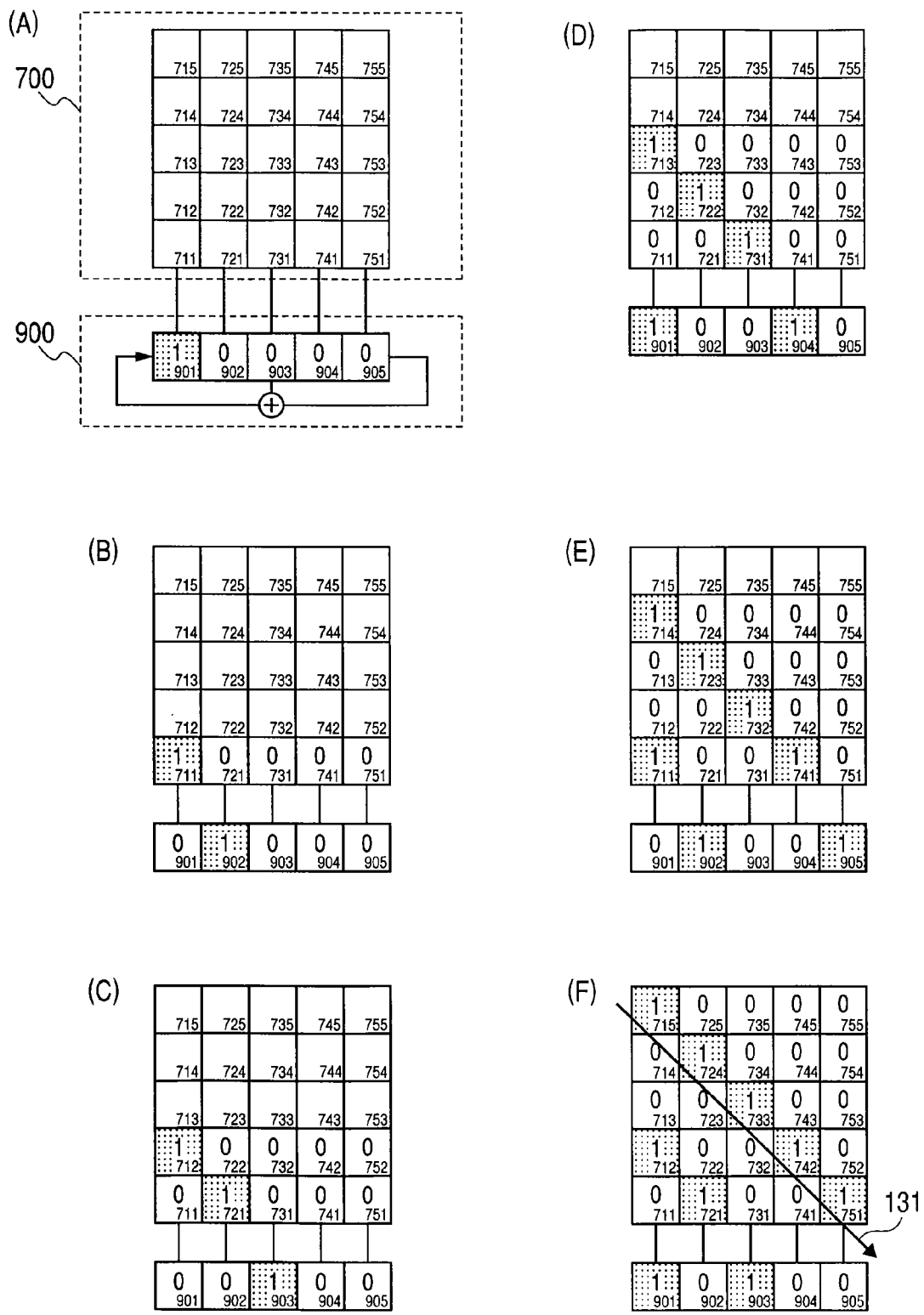
FIGS. 13A, 13B, 13C, 13D, 13E, and 13F are diagrams illustrating the operation of a main portion of a circuit that is compared with a self-diagnosis-type logic integrated circuit that is an example of a semiconductor device according to an embodiment of the invention.

FIG. 13A shows a state of the pattern generator 900 and the test target circuit 700 when a scan-in operation starts. FIG. 13B shows a state where a first scan clock is applied. The value that is stored in the storage element 901 is shifted to the storage element 902, and a random number that is newly generated by a feedback loop is stored in the storage element 901. Since the clocks of the pattern generator 900 and the storage elements 711 to 715, 721 to 725, 731 to 735, 741 to 745, and 751 to 755 that exist on the scan chains are the same, the values that are outputted from the storage elements 901 to 905 in FIG. 13A are scanned in the storage elements 711, 721, 731, 741, and 751 that exist on the scan chains. FIG. 13C shows a state where a second scan clock is applied. Similar to the case of FIG. 13B, the value that is stored in the storage element 901 is shifted to the storage element 902, and a random value that is newly generated by the feedback loop is stored in the storage element 901. In addition, scan-in data that is stored in the storage element 711 on the scan chain is shifted to the storage element 712, and the values that are outputted from the storage elements 901 to 905 in FIG. 13B are scanned in the storage elements 711, 721, 731, 741, and 751 that exist on the scan chains. FIG. 13E shows a state where the above-described process is repeated and test patterns are applied to all of the storage elements 711 to 715, 721 to 725, 731 to 735, 741 to 745, and 751 to 755 that exist on the scan chains of the test target circuit.

As such, when the pattern generator shown in FIGS. 13A to 13F is used, it can be seen that a rightward descending correlation is generated in the individual storage elements in the scan chain as shown by an arrow 131 in FIG. 13F, and the storage elements always have the same value during the test. For this reason, a failure that occurs only when the storage elements have different values cannot be detected, which results in deteriorating a detection rate.

Meanwhile, in the configuration that is shown in FIG. 1, since the inversion/non-inversion of the random number values that are outputted from the first random number generation circuit 100 can be controlled by the inversion control signal 450, a state where the test patterns are applied to all of the storage elements 711 to 715, 721 to 725, 731 to 735, 741 to 745, and 751 to 755 that exist on the scan chains of the test target circuit is as shown in FIG. 5E. Accordingly, it is possible to alleviate the rightward descending correlation that is shown by the arrow 131 in FIG. 13F. For this reason, since a failure that occurs only when the storage elements have different values can be detected, it is possible to prevent a detection rate from being deteriorated.

According to the above example, the following functions and effects can be obtained.

(1) Since the inversion/non-inversion of the random number values that are outputted from the first random number generation circuit 100 can be controlled by the inversion control signal 450, a state where the test patterns are applied to all of the storage elements 711 to 715, 721 to 725, 731 to 735, 741 to 745, and 751 to 755 that exist on the scan chains of the test target circuit is as shown in FIG. 5E. Accordingly, it is possible to alleviate the rightward descending correlation that is shown by the arrow 131 in FIG. 13F. For this reason, since a failure that occurs only when the storage elements have different values can be detected, it is possible to prevent a detection rate from being deteriorated.

(2) Like the technology that is disclosed in JP-A-Hei10 (1998)-170609, since a period of a clock of the scan chain does not need to be longer than that of a clock of the pattern generator, the number of clocks of the pattern generator needed for a test can be prevented from increasing, which results in preventing a test time from increasing.

Second Embodiment

Figure 6:
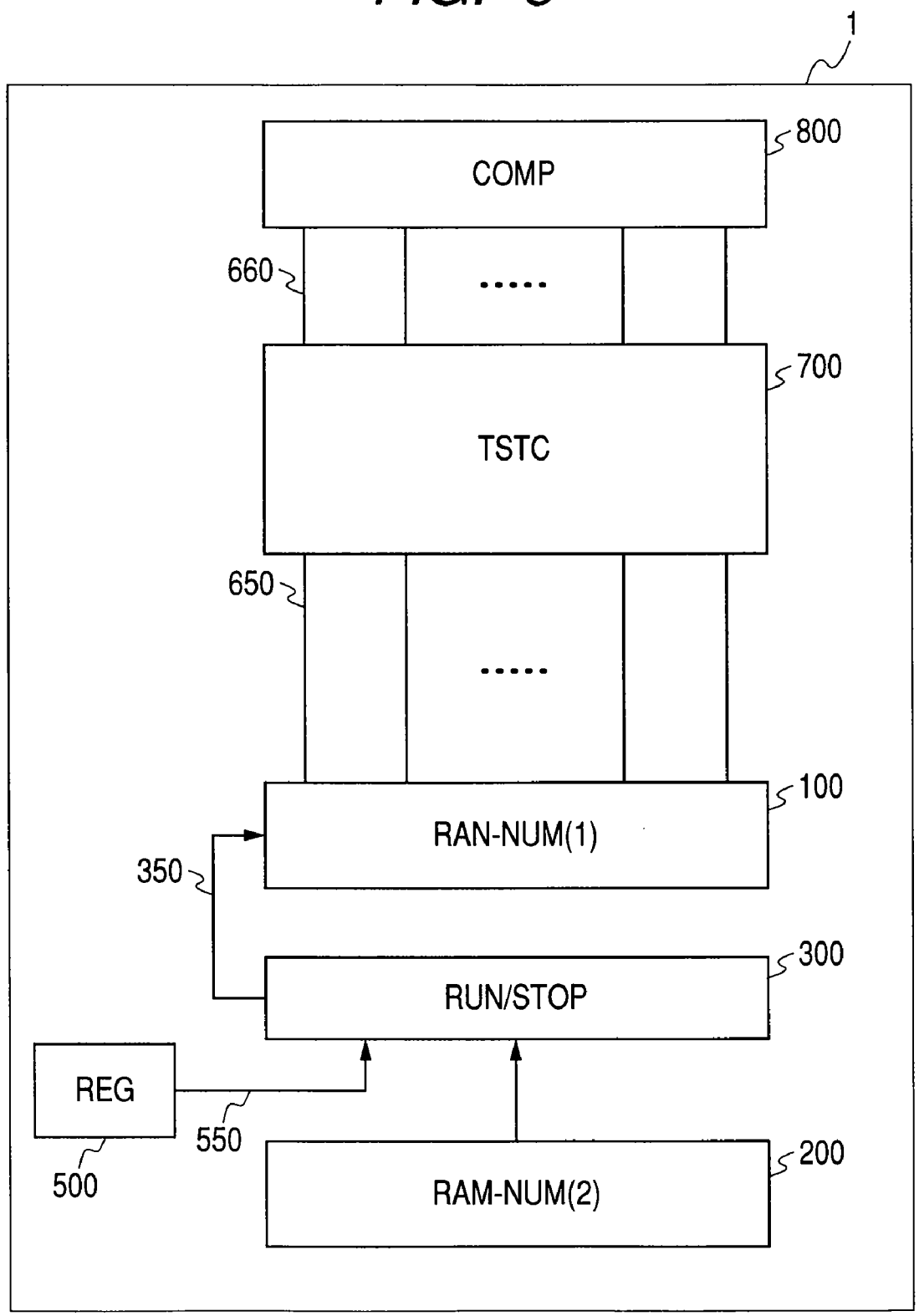
FIG. 6 is a block diagram illustrating another example of the configuration of a self-diagnosis-type logic integrated circuit that is an example of a semiconductor device according to an embodiment of the invention.

FIG. 6 shows another example of the configuration of the semiconductor integrated circuit 1. The semiconductor integrated circuit 1 shown in FIG. 6 is different from that shown in FIG. 1 in that a run/stop control circuit (RUN/STOP) 300 is provided, instead of the inversion control circuit 400 or the inversion logic unit 600.

Figure 7:
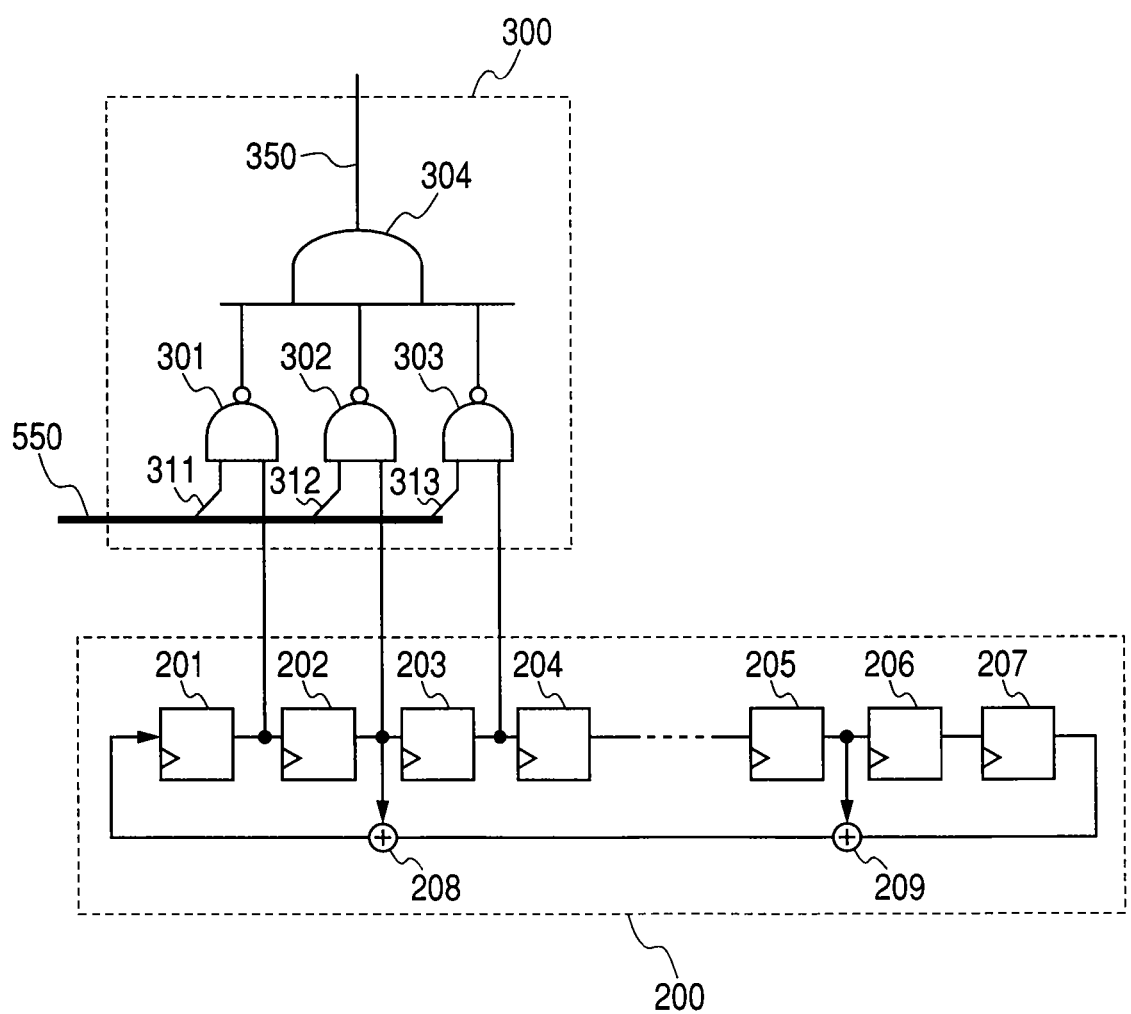
FIG. 7 is a circuit diagram illustrating an example of the configuration of a main portion of the self-diagnosis-type logic integrated circuit shown in FIG. 6.

FIG. 7 shows an example of the configuration of the second random number generator 200 and the run/stop control circuit 300.

The second random number generator 200 shown in FIG. 7 is basically the same as the second random number generator 200 shown in FIG. 2. However, in the second random number generator 200 shown in FIG. 7, output values of the storage elements 201, 202, and 203 are transmitted to the run/stop control circuit 300 at the rear stage.

The run/stop control circuit 300 is not limited to the specific configuration, but includes NAND elements 301 to 303 and an AND element 304. In the run/stop control condition setting signal group 550 of the condition setting circuit 500, the individual run/stop control condition setting signals 311, 312, and 313 are transmitted to input terminals of the NAND elements 301 to 303. In addition, the output values of the storage elements 201, 202, and 203 in the second random number generator 200 are transmitted to the other input terminals of the NAND elements 301 to 303. A NAND logic of the input signals is calculated by the NAND elements 301 to 303. The output signals from the NAND elements 301 to 303 are inputted to the AND element 304 at the rear stage, and an AND logic of the output signals from the NAND elements 301 to 303 is calculated by the AND element 304. The output signal from the AND element 304 is supplied to the first random number generator 100 at the rear stage as the run/stop control signal 350.

When the run/stop control condition setting signals 311 to 313 each have a logical value of "0", the run/stop control signal 350 always has a logical value of "1". When only one of the run/stop control condition setting signals 311 to 313 has a logical value of "1" and the other run/stop control condition setting signals each have a logical value of "0", depending on the output value of the second random number generator 200 that functions as a secondary random number generator, the run/stop control signal 350 has a logical value of "0" with the probability of ½ and a logical value of "1" at the probability of ½. In the same method, When two of the run/stop control condition setting signals 311 to 313 have a logical value of "1" and the other run/stop control condition setting signal has a logical value of "0", depending on the output value of the second random number generator 200 that functions as a secondary random number generator, the run/stop control signal 350 has a logical value of "0" with the probability of ¾ and a logical value of "1" at the probability of ¼. Hereinafter, in the same method as the above method, the appearance probability of a logical value "0" or "1" of the run/stop control signal 350 can be controlled depending on the value of the run/stop control condition setting signal group 550. That is, in accordance with the conditions set by the condition setting circuit 500, it is possible to control the appearance probability of the logical value "0" or "1" of the run/stop control signal 350.

In addition, if a state machine is incorporated in the condition setting circuit 500, even though external control is not performed while patterns are generated, it is possible to automatically change the run/stop control condition setting signal group 550 that is outputted from the condition setting circuit 500. That is, if the run/stop control condition setting signal group 550 is temporally changed by the state machine, it is possible to temporally change the appearance probability of the logical value "0" or "1" of the run/stop control signal 350.

Figure 8:
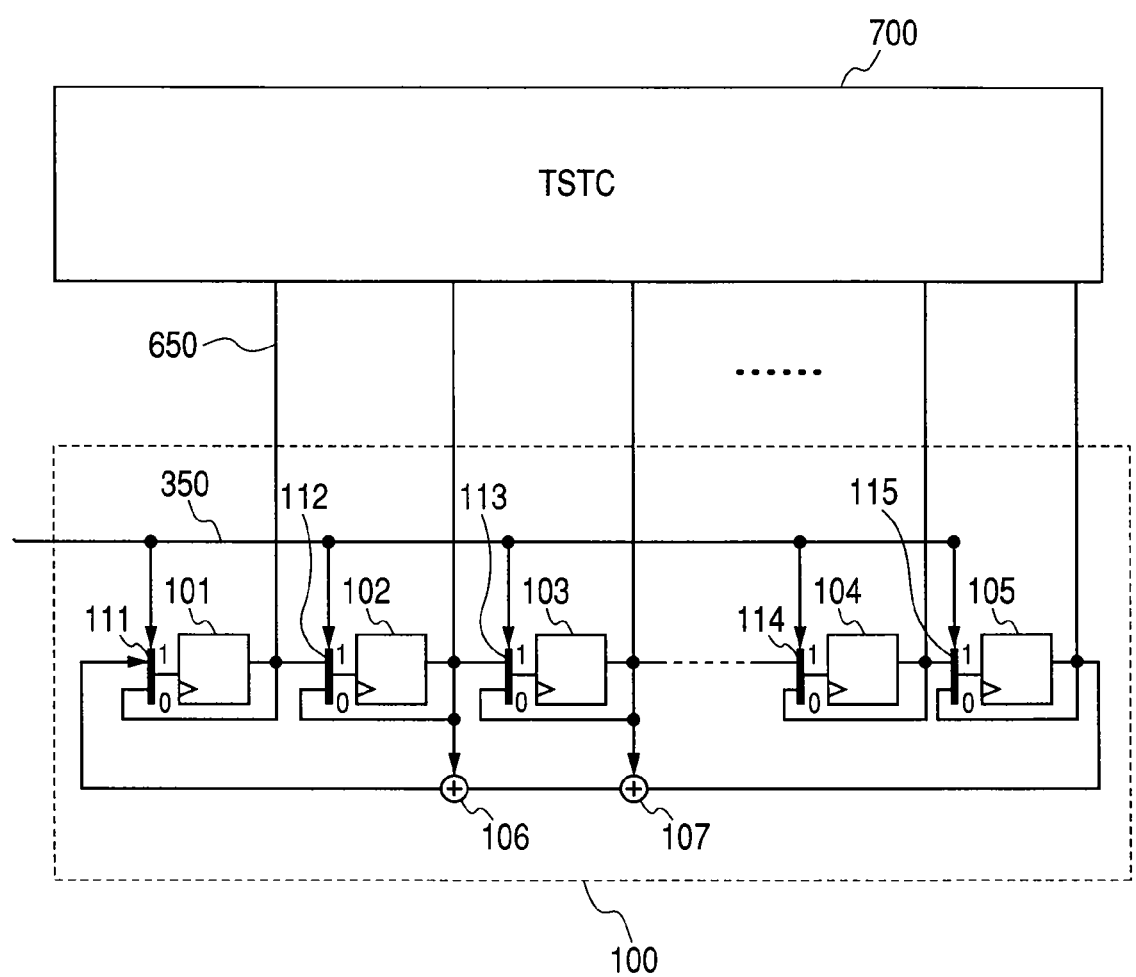
FIG. 8 is a circuit diagram illustrating an example of the configuration of a main portion of the self-diagnosis-type logic integrated circuit shown in FIG. 6.

FIG. 8 shows an example of the configuration of the first random number generation circuit 100. The configuration shown in FIG. 8 is different from the configuration shown in FIG. 3 in that selectors 111 to 115 are disposed to correspond to the storage elements 101 to 105. The selectors 111 to 115 can select signals input to the storage elements 101 to 105 corresponding to the selectors 111 to 115 in accordance with the run/stop control signal 350. When the run/stop control signal 350 has a logical value of "1", the output signal from the exclusive OR circuit 106 is selectively supplied to the storage element 101 by the selector 111, the output signal from the storage element 101 is selectively supplied to the storage element 102 at the rear stage by the selector 112, and the output signal form the storage element 102 is selectively supplied to the storage element 103 at the rear stage by the selector 113. In the same method, the output signal from the storage element at the previous stage is selectively supplied to the storage element 104 at the rear stage by the selector 114, and the output signal from the storage element 104 is selectively supplied to the storage element 105 at the rear stage by the selector 115. As a result, random numbers are generated by the first random number generation circuit 100 and supplied to the test target circuit 700. Meanwhile, when the run/stop control signal 350 has a logical value of "0", the output signal from the storage element 101 is selectively supplied to the storage element 101 by the selector 111, the output signal from the storage element 102 is selectively supplied to the storage element 102 at the rear stage by the selector 112, and the output signal form the storage element 103 is selectively supplied to the storage element 103 by the selector 113. In the same method, the output signal from the storage element 104 is selectively supplied to the storage element 104 by the selector 114, and the output signal from the storage element 105 is selectively supplied to the storage element 102 by the selector 115. In this state, the first random number generation circuit 100 cannot generate random numbers. Accordingly, the output values of the storage elements 101 to 105 are fixed.

In this case, the following case is considered. In FIG. 7, among the run/stop control condition setting signal group 550, only the run/stop control condition setting signal 311 has a logical value of "1", a scan shift operation is performed such that the remaining run/stop control condition setting signals 312 and 313 have a logical value of "0", and the logical value of the run/stop control signal 350 is changed to have "10101" for every shift clock.

FIGS. 9A to 9E show the concept of the first random number generator 100, the inversion logic unit 600, and the test target circuit 700. As described above, the logical value of the run/stop control signal 350 is changed to have "10101" for every shift clock.

FIG. 9A shows a state where a scan-in operation starts.

FIG. 9B shows a state where a first scan clock is applied. When a clock is applied, since the value of the run/stop control signal 350 is 1, the value that is stored in the storage element 101 is shifted to the storage element 102, and a newly generated random number is stored in the storage element 101. In addition, the values that are outputted from the storage elements 101 to 105 are scanned in the storage elements 711, 712, 713, 714, and 715 that exist on the scan chains.

FIG. 9C shows a state where a second scan clock is applied. When a clock is applied, since the value of the run/stop control signal 350 is 0, the storage elements 101 to 105 hold the values before the clock is applied. In addition, scan-in data that is stored in the storage element 711 on the scan chains is shifted to the storage element 712. In addition, the values that are outputted from the storage elements 101 to 105 are scanned in the storage elements 711, 712, 713, 714, and 715 that exist on the scan chains.

FIG. 9D shows a state where a third scan clock is applied. When a clock is applied, since the logical value of the run/stop control signal 350 is 1, the value that is stored in the storage element 102 is shifted to the storage element 103, the value that is stored in the storage element 101 is shifted to the storage element 102, and a newly generated random number is stored in the storage element 101. In addition, the values that are outputted from the storage elements 101 to 105 are scanned in the storage elements 711, 712, 713, 714, and 715 that exist on the scan chains.

FIG. 9E shows a state where the above-described process is repeated and test patterns are applied to all of the storage elements 711 to 715, 721 to 725, 731 to 735, 741 to 745, and 751 to 755 that exist on the scan chains of the test target circuit.

As such, if the run/stop control signal 350 is changed, it is possible to reduce a rate of change of data on the scan chain. In addition, a reduction ratio of a rate of change of data is determined by the probability of the run/stop control signal 350 becoming have a logical value of 0 during the scan shift. In this example, as described with reference to FIG. 5, it is possible to control the probability of the run/stop control signal 350 becoming have a logical value of 0 using the run/stop control condition setting signal group 550 output from the condition setting circuit 500. Accordingly, it is possible to control a rate of change of data on the scan chain.

According to the above example, the following functions and effects can be obtained.

(1) If the run/stop control signal 350 is changed, it is possible to reduce a rate of change of data on the scan chain. It is possible to control the probability of the run/stop control signal 350 becoming have a logical value of 0 using the run/stop control condition setting signal group 550 output from the condition setting circuit 500. Accordingly, it is possible to control a rate of change of data on the scan chain.

(2) In order to obtain the functions and effects of (1), in the BIST that includes the pattern generator using the linear feedback shift register, the generation of the random numbers by the pattern generator is stopped without blocking the clock signal. When the generation of the random numbers by the pattern generator is temporarily stopped by blocking the clock signal, it becomes difficult to design timing or layout. However, as described in the above case of (1), the selectors 111 to 115 select the outputs from the storage elements, the first random number generator 100 holds the values, and the same value is continuously output to the inversion logic unit 600. In this example, since the generation of the random numbers is temporarily stopped using the selectors 111 to 115 without blocking the clock signal, timing design or layout design is relatively easy.

Third Embodiment

Figure 10:
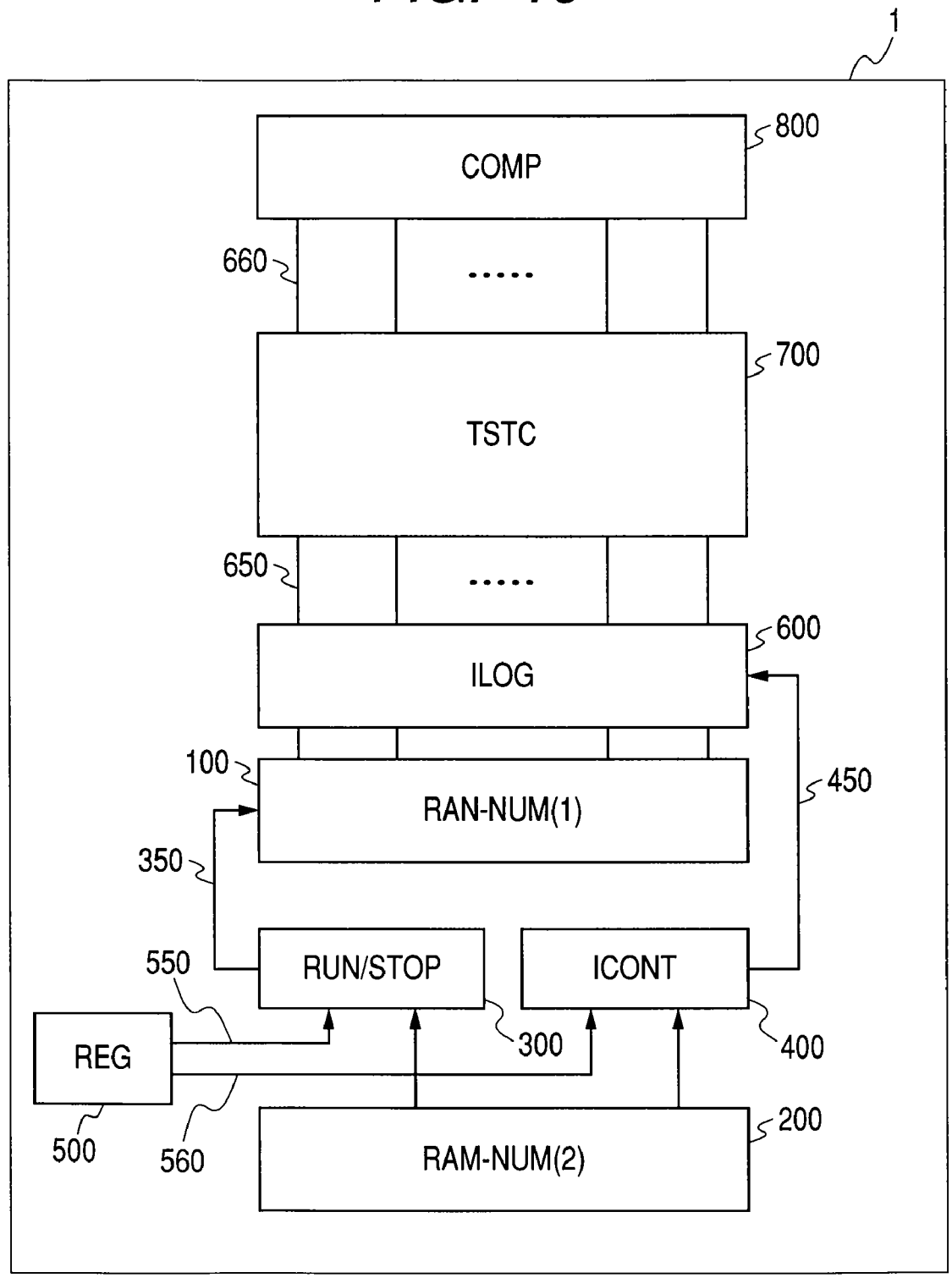
FIG. 10 is a block diagram illustrating another example of the configuration of a self-diagnosis-type logic integrated circuit that is an example of a semiconductor device according to an embodiment of the invention.

FIG. 10 shows another example of the configuration of the semiconductor integrated circuit 1.

In the semiconductor integrated circuit 1 shown in FIG. 10, similar to the configuration shown in FIG. 1, an inversion logic unit 600 and an inversion control circuit 400 that controls the inversions logic unit 600 are provided. In addition, similar to the configuration shown in FIG. 6, a run/stop control circuit 300 that controls the first random number generator 100 is provided.

FIGS. 11A to 11E show the operation of the first random number generator 100, the inversion logic unit 600, and the test target circuit 700. Specifically, FIGS. 11A to 11E show the case where a logical value of the run/stop control signal 350 is changed to have "10101" for every shift clock, and a logical value of the inversion control signal 450 is changed to have "00100" for every shift clock.

Figure 11:
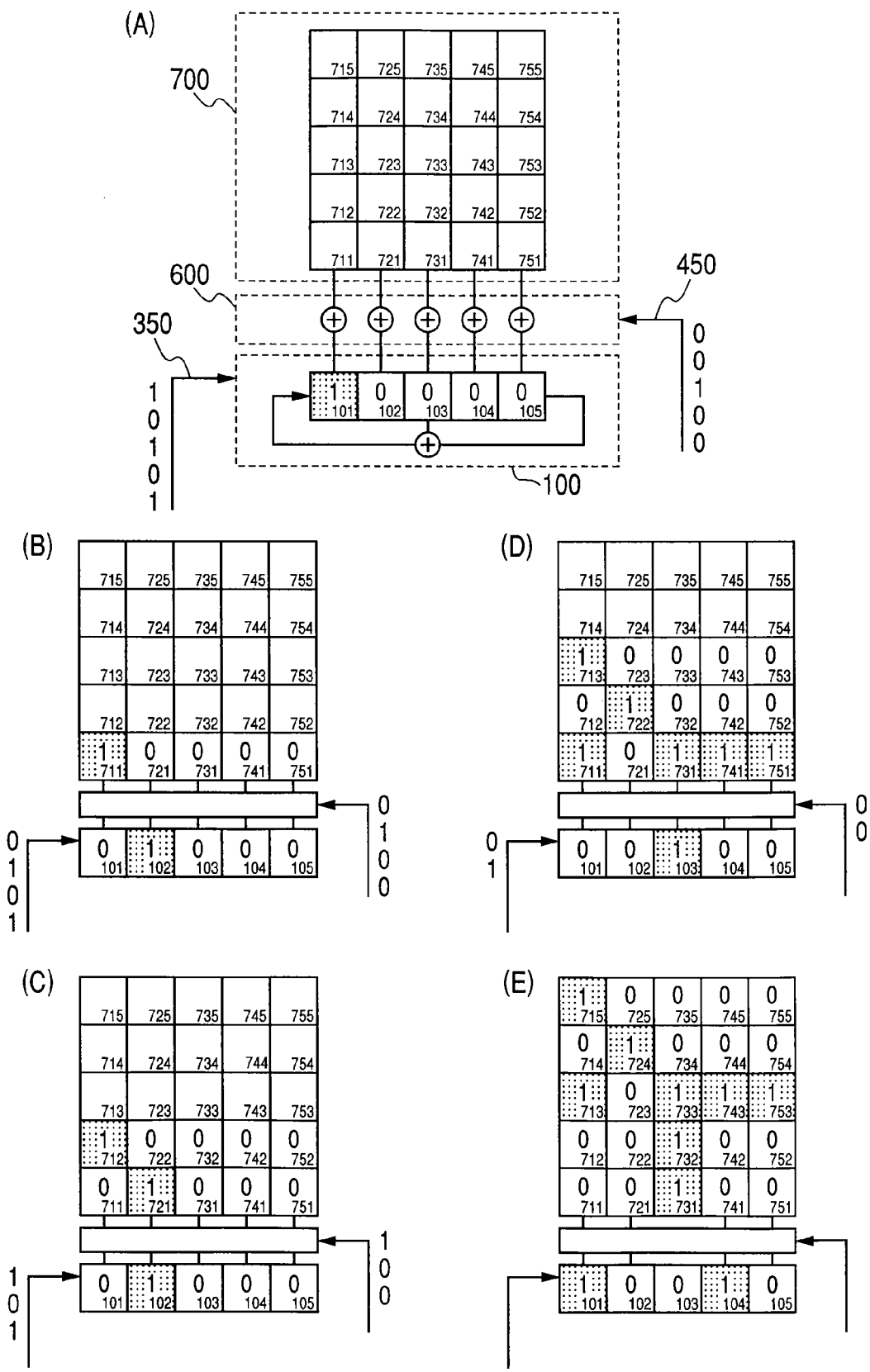
FIGS. 11A, 11B, 11C, 11D, and 11E are diagrams illustrating the operation of a main portion of the self-diagnosis-type logic integrated circuit shown in FIG. 10.

FIG. 11A shows a state where a scan-in operation starts.

FIG. 11B shows a state where a first scan clock is applied. When a clock is applied, since the logical value of the run/stop control signal 350 is 1, the value that is stored in the storage element 101 is shifted to the storage element 102, and a newly generated random number is stored in the storage element 101. In addition, since the logical value of the inversion control signal 450 is 0, the values that are outputted from the storage elements 101 to 105 are scanned in the storage elements 711, 712, 713, 714, and 715 that exist on the scan chains, without being inverted.

FIG. 11C shows a state where a second scan clock is applied. When a clock is applied, since the value of the run/stop control signal 350 is 0, the storage elements 101 to 105 hold the values before the clock is applied. In addition, scan-in data that is stored in the storage element 711 on the scan chain is shifted to the storage element 712. In addition, since the logical value of the inversion control signal 450 is 0, the values that are outputted from the storage elements 101 to 105 are scanned in the storage elements 711, 712, 713, 714, and 715 that exist on the scan chains, without being inverted.

FIG. 11D shows a state where a third scan clock is applied. When a clock is applied, since the logical value of the run/stop control signal 350 is 1, the value that is stored in the storage element 101 is shifted to the storage element 102, and a newly generated random number is stored in the storage element 101. In addition, scan-in data that is stored in the storage element 711 on the scan chain is shifted to the storage element 712. In addition, since the logical value of the inversion control signal 450 is "1", the values that are outputted from the storage elements 101 to 105 are inverted and scanned in the storage elements 711, 712, 713, 714, and 715 that exist on the scan chains.

FIG. 11E shows a state where the above-described process is repeated and test patterns are applied to all of the storage elements 711 to 715, 721 to 725, 731 to 735, 741 to 745, and 751 to 755 that exist on the scan chains of the test target circuit.

As described above, the run/stop control signal 350 and the inversion control signal 450 are simultaneously changed and the condition is set in consideration of a rate of change of data on the scan chain and a detection ratio of a failure at the time of the test. As a result, the test patterns can be generated. According to this embodiment, it is possible to obtain both the functions and effects of the first embodiment and the functions and effects of the second embodiment.

The invention that has been developed by the inventors has been described in detail. However, the invention is not limited thereto, and various changes and modifications can be made without departing from the sprit and scope of the invention.

Figure 12:
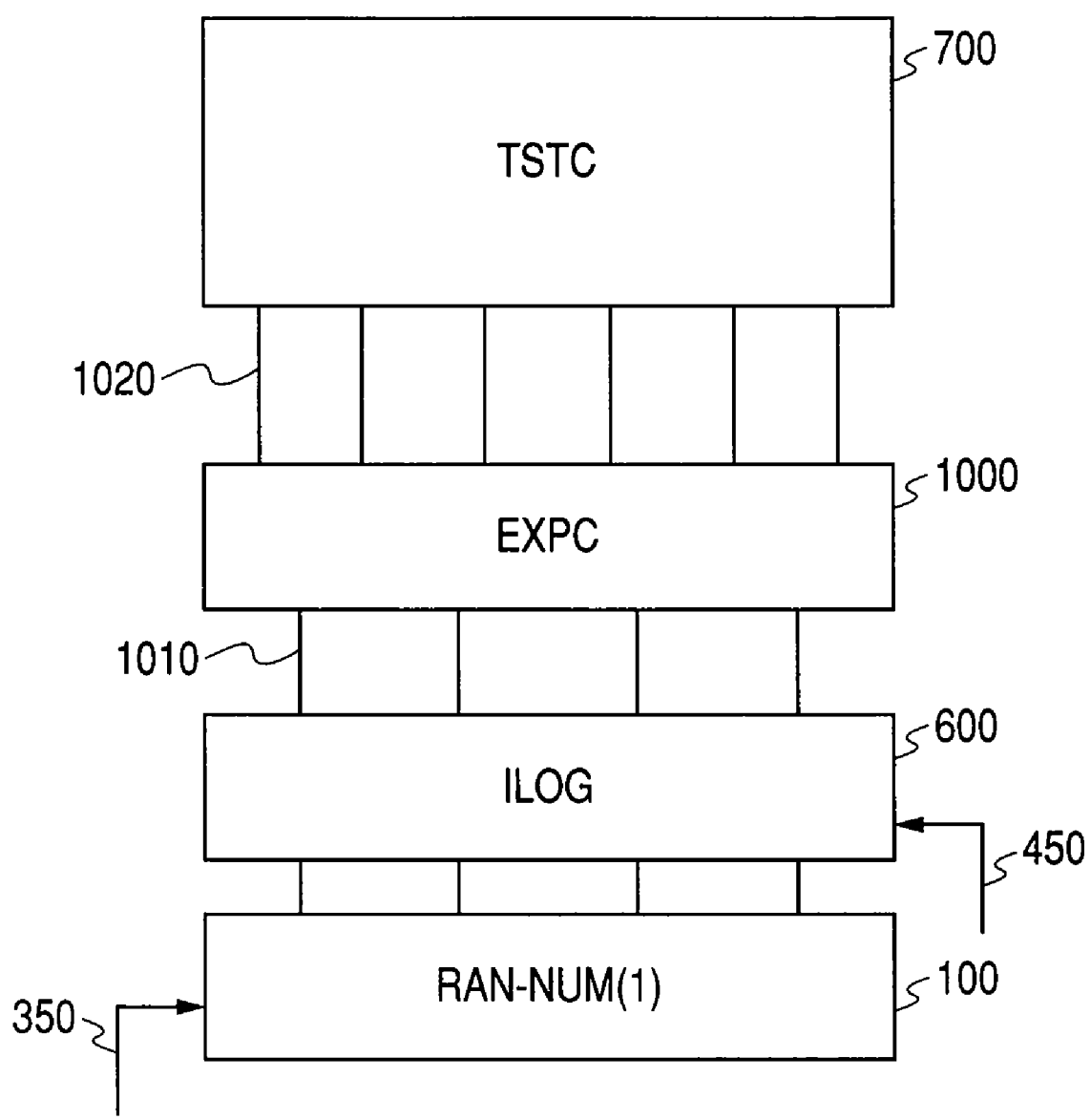
FIG. 12 is block diagram illustrating another example of the configuration of the self-diagnosis-type logic integrated circuit that is an example of a semiconductor device according to an embodiment of the invention.

For example, as shown in FIG. 12, when the number of scan chains of the test target circuit 700 is different from the number of nets output from the first random number generator 100, a spatial extension circuit (EXPC) 1000 that is configured using a combination logic is provided between the inversions logic unit 600 and the test target circuit 700, and the output from the first random number generator 100 is transmitted to the test target circuit 700 through the spatial extension circuit 1000. Even in this configuration, the logic inversion control in the inversion logic unit 600 or the run/stop control in the first random number generator 100 is performed. As a result, it is possible to reduce a rate of change of data on the scan chain and alleviate a correlation between the storage elements in the scan chain.

In the above description, the description is given to the case where the invention developed by the inventors is applied to the self-diagnosis-type logic integrated circuit as the utilization field that has become the background. However, the invention is not limited thereto, and may be widely applied to various semiconductor devices.

What is claimed is:

1. A semiconductor device comprising:
a test target circuit to be tested;
scan chains that enable scanning of the test target circuit;
a first random number generation circuit that generates random numbers to form test patterns supplied to the scan chains;
a second random number generation circuit that is provided separately from the first random number generation circuit and generates random numbers; and
a random number control circuit that uses the random numbers generated by the second random number generation circuit to change the random numbers generated by the first random number generation circuit,
wherein the random number control circuit includes
an inversion logic unit that inverts a logic of an output value from the first random number generation circuit;
a condition setting circuit that sets an inversion control condition in the inversion control circuit; and
an inversion control circuit that uses the random numbers generated by the second random number generation circuit to control the operation of the inversion logic unit, under the condition set by the condition setting circuit,
wherein an output signal from the inversion logic unit is supplied to the test target circuit.

2. A semiconductor device comprising:
a test target circuit to be tested;
scan chains that enable scanning of the test target circuit;
a first random number generation circuit that generates random numbers to form test patterns supplied to the scan chains;
a second random number generation circuit that is provided separately from the first random number generation circuit and generates random numbers; and
a random number control circuit that uses the random numbers generated by the second random number generation circuit to change the random numbers generated by the first random number generation circuit,
wherein the random number control circuit includes
an inversion logic unit that inverts a logic of an output value from the first random number generation circuit; and
an inversion control circuit that uses the random numbers generated by the second random number generation circuit to control the operation of the inversion logic unit,
wherein an output signal from the inversion logic unit is supplied to the test target circuit, and
wherein the inversion logic unit includes an exclusive OR circuit that performs an exclusive OR operation on an output signal from the first random number generation circuit and an inversion control signal output from the inversion control circuit.

3. A semiconductor device comprising:
a test target circuit to be tested;
scan chains that enable scanning of the test target circuit;
a first random number generation circuit that generates random numbers to form test patterns supplied to the scan chains;
a second random number generation circuit that is provided separately from the first random number generation circuit and generates random numbers; and
a random number control circuit that uses the random numbers generated by the second random number generation circuit to change the random numbers generated by the first random number generation circuit,
wherein the random number control circuit includes a run/stop control circuit that uses the random numbers generated by the second random number generation circuit to control the random number generation operation to run or stop in the first random number generation circuit.

4. A semiconductor device comprising:
a test target circuit to be tested;
scan chains that enable scanning of the test target circuit;
a first random number generation circuit that generates random numbers to form test patterns supplied to the scan chains;
a second random number generation circuit that is provided separately from the first random number generation circuit and generates random numbers; and
a random number control circuit that uses the random numbers generated by the second random number generation circuit to change the random numbers generated by the first random number generation circuit,
wherein the random number control circuit includes
a run/stop control circuit that uses the random numbers generated by the second random number generation circuit to control the random number generation operation to run or stop in the first random number generation circuit; and
a condition setting circuit that sets a control condition in a run/stop control circuit,
wherein the appearance probability of a logical value that is outputted from the run/stop control circuit is controlled on the basis of the condition set by the condition setting circuit.

5. The semiconductor device according to claim 4,
wherein the condition setting circuit includes a state machine that temporally changes the appearance probability of an logical value output from the run/stop control circuit.

6. A semiconductor device comprising:
a test target circuit to be tested;
scan chains that enable scanning of the test target circuit;
a first random number generation circuit that generates random numbers to form test patterns supplied to the scan chains;
a second random number generation circuit that is provided separately from the first random number generation circuit and generates random numbers; and
a random number control circuit that uses the random numbers generated by the second random number generation circuit to change the random numbers generated by the first random number generation circuit,
wherein the random number control circuit includes an inversion logic unit that inverts a logic of an output value from the first random number generation circuit,
an inversion control circuit that uses the random numbers generated by the second random number generation circuit to control the operation of the inversion logic unit, and
a run/stop control circuit that uses the random numbers generated by the second random number generation circuit to control the random number generation operation to run or stop in the first random number generation circuit, and
wherein an output signal from the inversion logic unit is supplied to the test target circuit.

* * * * *